United States Patent [19]

Taka

[11] Patent Number: 4,886,983
[45] Date of Patent: Dec. 12, 1989

[54] RESET PULSE GENERATING DEVICE
[75] Inventor: Hideo Taka, Tokyo, Japan
[73] Assignee: Canon Kabushiki Kaisha, Tokyo, Japan
[21] Appl. No.: 649,152
[22] Filed: Sep. 10, 1984

Related U.S. Application Data

[63] Continuation of Ser. No. 329,998, Dec. 11, 1981.

[30] Foreign Application Priority Data

Dec. 26, 1980 [JP] Japan .................... 55-187169

[51] Int. Cl.$^4$ ............... H03K 17/22; H03K 17/20; H03K 5/153; H03K 17/687
[52] U.S. Cl. .................... 307/272.3; 307/597; 307/296.5
[58] Field of Search ............ 307/592, 593, 594, 595, 307/596, 597, 296 R, 268, 571, 584, 475, 200 A, 200 B, 603, 228, 272.3, 605

[56] References Cited

U.S. PATENT DOCUMENTS

| | | | |
|---|---|---|---|
| 3,197,656 | 7/1965 | Kintner | 307/603 |
| 3,351,776 | 11/1967 | Chin | 307/603 X |
| 3,692,393 | 9/1972 | Anderl | 307/603 X |
| 3,950,654 | 4/1976 | Broedner et al. | 307/592 X |
| 4,054,804 | 10/1977 | Tanaka | 307/603 X |
| 4,124,807 | 11/1978 | Herber | 307/279 |
| 4,306,191 | 12/1981 | Bader | 307/571 X |
| 4,365,174 | 12/1982 | Kucharewski | 307/593 X |
| 4,367,422 | 1/1983 | Leslie | 307/592 X |
| 4,553,054 | 11/1985 | Kase et al. | 307/605 X |

Primary Examiner—John S. Heyman
Assistant Examiner—David R. Bertelson
Attorney, Agent, or Firm—Toren, McGeady & Associates

[57] ABSTRACT

The disclosed preset pulse generating device serves a digital system which is controlled by a clock pulse oscillating circuit and returned to the initial state by a reset pulse. It includes a first circuit which is charged to a predetermined level when the clock pulse oscillating circuit is operating, and a charge level detecting circuit for producing the reset pulse when the output of the first circuit falls below the predetermined level as the clock pulse oscillating circuit stops operating.

19 Claims, 1 Drawing Sheet

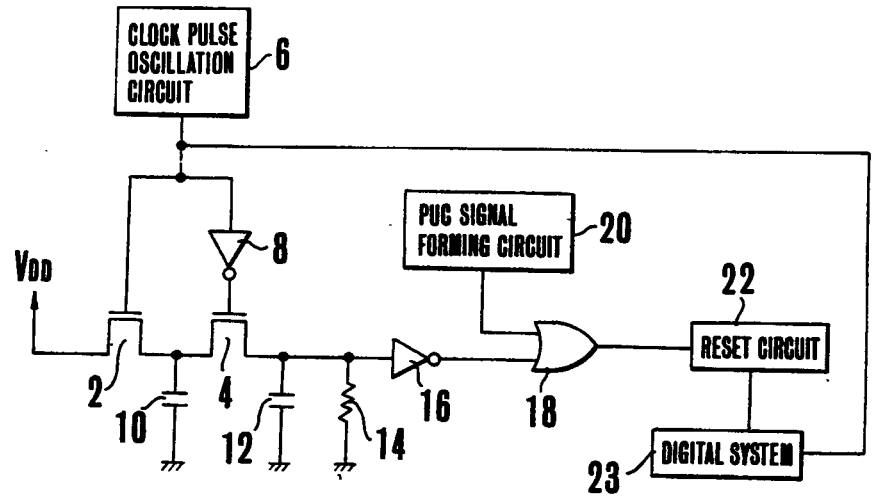

RESET PULSE GENERATING DEVICE

This is a continuation of application Ser. No. 329,998, filed Dec. 11, 1981.

BACKGROUND OF THE INVENTION

1. Field of the Invention

This invention relates to reset pulse generating devices, and more particularly to a device for producing a reset pulse by which the output of a digital system is returned to an initial state.

2. Description of the Prior Art

In the past, control of a digital system has been accomplished by clock pulses from either a built-in, or an external clock pulse oscillation circuit. Therefore, it generally follows that when, for some cause, for example, when a drop in the battery voltage for the oscillation circuit stops the production of the clock pulses, the interior condition of the digital system is latched, and its output terminal continues holding the state that existed just before the termination of oscillation.

This raises a serious problem, for example, when the same battery used as the electrical power source of the digital system also serves as an electrical power source to drive a large current load.

Suppose, for example, an apparatus such as a camera equipped with the motor driven winder is controlled by the logic of the digital system. Then, when some trouble occurs during the period of energization of the motor of the winder, or when the battery voltage necessarily drops enough to stop rotation of the motor, and, therefore, falls below a satisfactory operating level for the oscillation circuit, the clock pulses are no longer produced, and the logic for interrupting the current supply to the motor, for example, the logic for the timer no longer operates. Since, in this case, the logic causes current supply to the motor run on, the motor continues to be supplied with current. This gives rise to a big problem in that the battery generates heat and in extreme cases leaks chemicals. Such problem may be encountered in any other apparatus where the battery is used as the electrical power source of the digital system. Some solution to this has, therefore, been sought.

SUMMARY OF THE INVENTION

An object of the present invention is to eliminate the above-described drawbacks of the prior art, and to provide a reset pulse generating device responsive to detection of a stoppage of oscillation of a clock pulse oscillation circuit for immediately returning the condition of a system to the initial one thereby making it possible to avoid undesirable influences on the instrument to be controlled.

BRIEF DESCRIPTION OF THE DRAWING

The drawing is an electrical circuit diagram, partly in block form, of an embodiment of a reset pulse generating device according to the present invention.

DETAILED DESCRIPTION OF PREFERRED EMBODIMENT

The reset pulse generating device of the invention will next be described in greater detail by reference to the drawing.

In FIG. 1, a first analog switch 2 has an input which is connected to an electrical power source VDD, for example battery. The control inputs of the first analog switch 2 and a second analog switch 4 are respectively connected to receive clock pulses from a clock pulse oscillation circuit 6 and the output of a first inverter 8 through which the clock pulses passes, or the inverted signal of the clock pulses. When the clock pulse from the clock pulse oscillation circuit 6 is high, (hereinafter described as H or H level), the first analog switch 2 is rendered conductive, and a first capacitor 10 is charged by the battery VDD. Since, at this time, the inverted signal of the clock pulse goes low (hereinafter described as L or L level), the second analog switch 4 remains non-conductive. Then when the clock pulse changes to L level, the first analog switch 2 is rendered non-conductive. Since, at this time, the inverted signal of the clock pulse assumes the H level, the second analog switch 4 is rendered conductive, so that the charge stored on the capacitor 10 is discharged, and stored on a second capacitor 12. Then, when the clock pulse changes to the H level again, the first analog switch 2 is rendered conductive, so that the first capacitor 10 is charged. Since, at this time, the inverted signal of the clock pulse becomes L, the second analog switch 4 is rendered con-conductive and the charge stored on the second capacitor 12 is discharged through a resistor 14. The time constant of the second capacitor 12 and the resistor 14 is chosen so as to initiate the next charge before the voltage at the input of a second inverter drops below its threshold value as the charge on the second capacitor is discharged. Hence, the input of the second inverter 16 is always at the H level. Therefore, as long as the production of the clock pulses continues, the output of the second inverter 16 assumes the L level. Except when the power-up clear signal from a power-up clear signal forming circuit 20 at the time of turning on the battery is at the H level, and this signal is applied to another input of an OR gate 18, an early-stage reset circuit 22, has its input set to an L level and does not carry out its early-stage resetting function. This permits a digital system 23 to operate in response to the clock pulses from the clock pulse oscillation circuit 6.

Now assuming that for some reason something causes the clock pulse oscillation circuit to stop producing more clock pulses and that in the first case the phase of the last clock pulse is H, then the inverted signal of this clock pulse is maintained at L then, the second analog switch 4 remains non-conducting. Therefore, as the charge stored on the second capacitor 12 is discharged through the resistor 14, the input voltage of the second inverter 16 reaches its threshold value in a predetermined time at which the output of the second inverter 16 changes for the first time to H. In the second case where the phase of the last clock pulse is L, then the first analog switch 2 remains non-conducting. Because the inverted signal of the clock pulse is maintained at H level, as the second analog switch 4 remains conductive, the charge stored on the first capacitor 10 is discharged through the resistor 14. Then, the input voltage of the second inverter 16 falls below the threshold level in the predetermined time and changes its output for the first time to H level. Thus, the accidental stoppage of production of the clock pulses, regardless of the level the last clock pulse results in, the second inverter 16 changing its output to H in the predetermined time. This H level serves as a reset pulse. Therefore, the output of the OR gate 18 also is changed to H in response to inversion of the output of the inverter 16, so that the early-stage reset circuit 22 is actuated. This makes it possible to place the digital system 23, for example, a digitally-controlled camera system in its initial state.

As has been described in greater detail, according to the present invention, a very simple device suffices to make it possible to return the system the initial state as soon as the clock pulses stop. This offers a great advantage from the standpoint of industries whose systems are protected from destruction.

What is claimed is:

1. A reset pulse generating device for a digital system which is controlled by a clock pulse oscillation circuit and returned to the initial state by a reset pulse, including:
   (a) charge storing means responsive to operation of said clock pulse oscillation circuit to be charged during oscillation of the oscillation circuit at a given charging rate;
   (b) discharge means for discharging the charge storage means at a predetermined rate slower than the charging rate so that during operation of said clock pulse oscillation circuit, said charge storing means, despite being discharged, prevents its charge level from becoming lower than a predetermined value, and, after the operation of said clock pulse oscillation circuit stops, the charge level of said charge storing means is discharged below the aforesaid predetermined value; and
   (c) detecting means for producing a reset pulse when the output of said charge storing means falls below said predetermined level.

2. A device according to claim 1, wherein said charge storing means includes an output terminal and said detecting means has an inverter which is connected to the output terminal of said charge storing means.

3. A device according to claim 1, wherein said charge storing means includes first and second capacitors connected to be alternately charged in response to the clock pulses from said clock pulse oscillation circuit.

4. A device as in claim 1, wherein the oscillating circuit assumes two states, and wherein said charge storing means includes:
   first capacitor means for receiving and holding a charge;
   second capacitor means for receiving and holding a charge;
   first circuit means for charging said first capacitor means when the oscillation circuit assumes the first state; and
   second circuit means for charging said second capacitor means when the oscillation circuit assumes the second state; and
   wherein said discharge means includes third circuit means for maintaining the charge on said second capacitor means for a predetermined time longer than the clock pulses produced by the oscillation circuit.

5. A device as in claim 1, wherein said oscillation circuit produces clock pulses having a predetermined time, and said charge storing circuit includes:
   a first capacitor;
   a second capacitor;
   an inverter;
   a first switch; and
   a second switch;
   said first switch being connected to said first capacitor to charge said first capacitor in response to said oscillation circuit and said second switch connecting said first and second capacitors and being connected to the output of said inverter to receive the pulses from the oscillation circuit through said inverter for charging the second capacitor so that said first and second switches are held open alternately; and
   wherein said discharge means includes means for discharging the capacitors at a rate slower than the clock pulse rate of the oscillation circuit.

6. A device as in claim 1, wherein said oscillation circuit produces clock pulses having a predetermined time, and said charge storing circuit includes:
   a first capacitor;
   a second capacitor;
   an inverter;
   a first switch; and
   a second switch;
   said first switch being connected in series with said first capacitor and with said second switch, said second switch being connected in series with said second capacitor, one of said switches being connected to the oscillation circuit to receive pulses therefrom while maintaining the polarity of the pulses and the other of said switches being connected to the oscillation circuit through said inverter; and
   wherein said discharge means includes means connected to said second capacitor for maintaining the charge across the second capacitor for a time longer than the pulses of the oscillation circuit.

7. A device as in claim 1, wherein said detecting means is coupled to said charge storing means for detecting the level of charge in said charge storing means; and
   said charge storing means is coupled to the oscillation circuit to charge in response to operation of the oscillation circuit and discharge at a slower rate than the charging rate in response to cessation of operation of the oscillation circuit.

8. A device as in claim 7, wherein the digital system is energized by a source and further comprising coupling means for said charge storing means to the source.

9. A device as in claim 4, wherein:
   said first circuit means is coupled to said first capacitor and arranged to be coupled to a voltage source;
   said second circuit means couples said first capacitor to said second capacitor; and
   said third circuit means is connected to said second capacitor.

10. A device as in claim 5, wherein said first capacitor means arranged to be connected to a circuit source.

11. A device as in claim 6, wherein said first capacitor means arranged to be connected to a circuit source.

12. A device as in claim 5, wherein said means for discharging is connected to said second capacitor.

13. A device as in claim 1, wherein said charge storing means is arranged to stop charging in response to said oscillator stopping oscillation.

14. A device as in claim 1, wherein said oscillation circuit produces clock pulses having a predetermined time, and said charge storing circuit includes:
   a first capacitor;
   a second capacitor;
   an inverter;
   a first switch; and
   a second switch;
   said first switch being coupled to said first capacitor to charge said first capacitor when said first switch is activated by pulses, said second switch coupling said first capacitor to said second capacitor for passing current from said first capacitor to said second capacitor so as to charge said second capacitor when said second switch is energized by pulses, said oscillator and said inverter being coupled to said switches to alternately apply pulses to said first switch and said second switch; and wherein said discharge means includes means connected to said second capacitor for maintaining the charge across the second capacitor for a time longer than one of the pulses of said oscillation circuit.

15. A device as in claim 7, wherein said digital system is energized by a source and said charge storing means is responsive to the source.

16. A device as in claim 4, wherein:
said first circuit means is coupled to said first capacitor and responsive to a voltage source;
said second circuit means couples said first capacitor to said second capacitor; and
said third circuit means is connected to said second capacitor.

17. A device as in claim 5, wherein said first capacitor means is responsive to a circuit source.

18. A device as in claim 6, wherein said first capacitor means is responsive to a circuit source.

19. A reset pulse generating device for a digital system which is controlled on the basis of a pulse signal from a clock pulse oscillation circuit and placed in a reset state by a reset pulse, comprising:
 (a) charging storing means for storing a charge;
 (b) charge supplying means for supplying a charge corresponding to the pulse signal from the clock pulse oscillation circuit to said charge storing means;
 (c) discharge means connected to continuously discharge the charge stored at said charge storing means at a discharge rate slow enough to prevent bringing a charging level of said charge storing means below a predetermined value when said charge storing means supplies a charge from the charge supplying means during normal operation of said clock pulses oscillating circuit; and
 (d) detecting means for detecting that said clock pulse oscillation circuit does not perform properly and the charge is not supplied properly from the charge supplying means, the charge level of the charge storing means falls below the predetermined value by said discharge means, and for producing the reset signal to place the digital system in a reset state.

* * * * *